(12) United States Patent
Katoh

(10) Patent No.: US 6,683,802 B2
(45) Date of Patent: Jan. 27, 2004

(54) MAGNETIC MEMORY DEVICE IN WHICH INFLUENCE OF ADJACENT MEMORY CELL IS CONTROLLABLE

(75) Inventor: Yuukoh Katoh, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/175,442

(22) Filed: Jun. 20, 2002

(65) Prior Publication Data
US 2002/0196657 A1 Dec. 26, 2002

(30) Foreign Application Priority Data
Jun. 22, 2001 (JP) ........................................ 2001/189152

(51) Int. Cl.$^7$ ............................ G11C 11/22; G11C 11/14
(52) U.S. Cl. ........................... 365/145; 365/97; 365/171
(58) Field of Search ........................... 365/145, 97, 171, 365/117, 74, 65

(56) References Cited

U.S. PATENT DOCUMENTS 6,483,741 B1 * 11/2002 Iwasaki et al. ............. 365/170
6,509,621 B2 * 1/2003 Nakao ....................... 365/171

* cited by examiner

*Primary Examiner*—Thong Le
(74) *Attorney, Agent, or Firm*—Sughrue Mion, PLLC

(57) ABSTRACT

A magnetic memory device includes a plurality of word lines extending into a first direction, a plurality of bit lines extending into a second direction, and a plurality of magnetic memory cells which are provided at intersections of the word lines and the bit lines. Each of the memory cells includes a ferromagnetic film. Data is written in a first one of the magnetic memory cells with a synthetic magnetic field generated by first current flowing on a specific word line associated with the first magnetic memory cell and second current flowing on a specific bit line associated with the first magnetic memory cell.

21 Claims, 15 Drawing Sheets

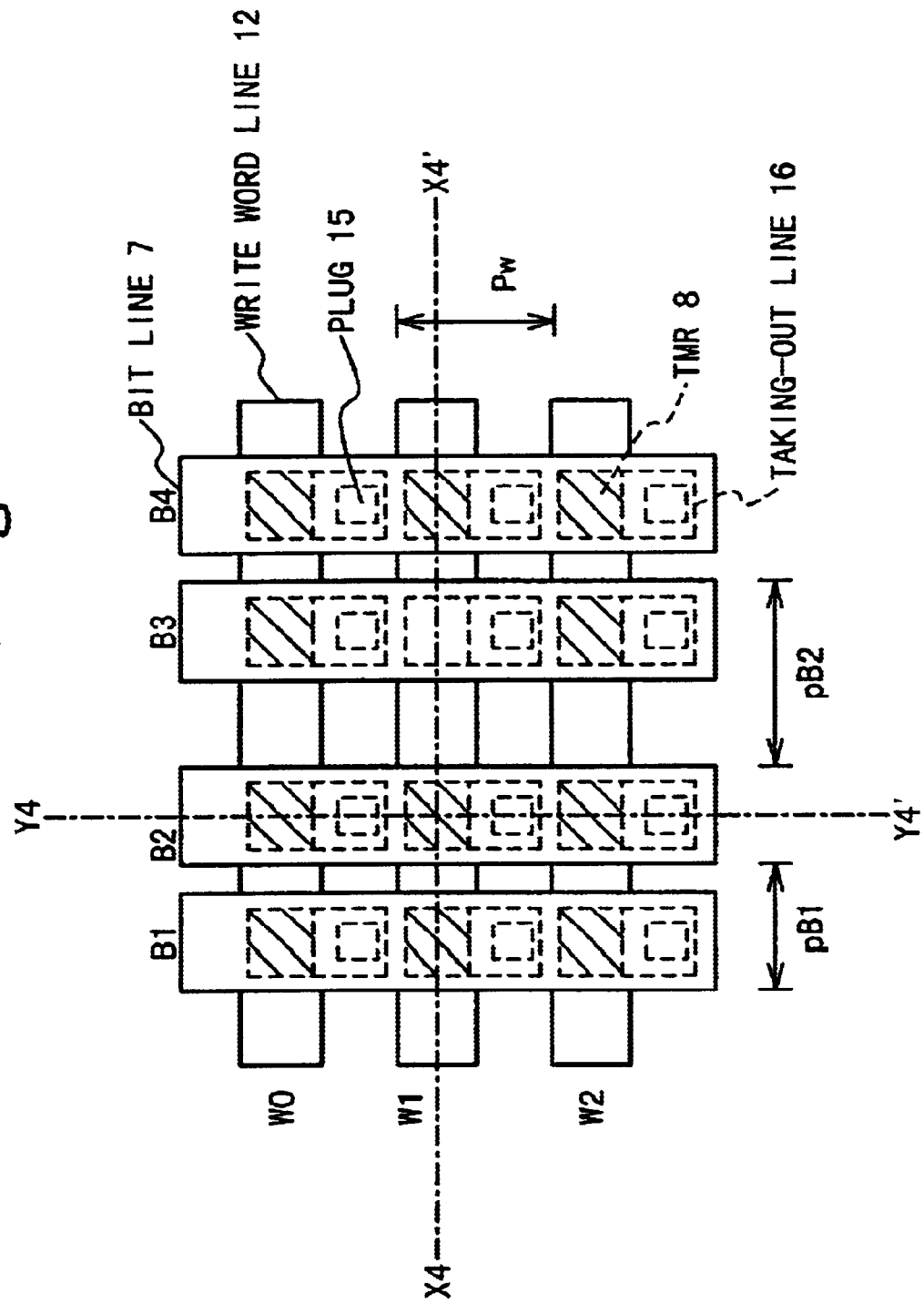

US 6,683,802 B2

MAGNETIC MEMORY DEVICE IN WHICH INFLUENCE OF ADJACENT MEMORY CELL IS CONTROLLABLE

BACKGROUND OF THE INVENTION

1. Field of the Invention

The present invention relates to a magnetic memory device and a method of designing the same. More particularly, the present invention relates to a magnetic memory device which carries out a reading/writing operation of data using magnetic reversal in a magnetic substance element, and a method of designing the same.

2. Description of the Related Art

In recent years, the development of a magnetic random access memory (MRAM) using a magnetic resistance element as a memory element has carried forward. In the magnetic resistance element, a reading/writing operation is carried out using magnetic reversal which is brought about by a local magnetic field. The MRAM is expected to be a memory device of the next generation, because with MRAM, it is possible to operate at high speed.

The structure in which a tunnel insulating film is put between two magnetic substance films is called tunneling magnetroregistance (TMR). The TMR structure will be described below as an example of the magnetic resistance element. FIG. 1 shows an example of the TMR reported in 2000 IEEE International Solid-State Circuits Conference DIGEST OF TECHNICAL PAPERS (p. 128). Referring to FIG. 1, an anti-ferromagnetic substance layer 30 formed of FeMn (10 nm), a ferromagnetic substance pin layer 31 formed of CoFe (2.4 nm), the tunnel insulating layer 32 formed of $Al_2O_3$, and a ferromagnetic substance free layer 33 formed of NiFe (5 nm) are stacked.

Conductive wiring lines are connected with the anti-ferromagnetic substance layer 30 and the free layer 33 to make it possible to apply a voltage. A magnetization direction of the pin layer 31 is fixed on a specific direction by the anti-ferromagnetic substance layer 30. The free layer 33 is formed to be easily magnetized and the magnetization direction of the free layer 33 can be changed by an externally applied magnetic field. It should be noted that a direction to which it is easy for the free layer to be magnetized is referred to as an easy axis and a direction to which it is difficult for the free layer to be magnetized and which is orthogonal to the easy direction is referred to as a hard axis.

In the TMR of the above structure, current flows through the tunnel insulating film 32 when a voltage is applied between the free layer 33 and the pin layer 31. In this case, a resistance value changes based on the relation of the magnetization of the free layer 33 and the magnetization of the pin layer 31. That is, when the magnetization directions are the same, the resistance is low. When the magnetization directions are different from each other, the resistance becomes high. Therefore, data can be stored by changing the magnetization direction of the free layer 33.

Next, an example using the above TMR as a memory element of a nonvolatile memory will be described with reference to FIG. 2. This example is reported in 2000 IEEE International Solid-State Circuits Conference DIGEST OF TECHNICAL PAPERS (p. 130). Referring to FIG. 2, in this example, the TMRs 34 are arranged at the intersections of upper wiring lines B (B1, B2) 35 and lower wiring lines D (D1, D2, D3) 38 in an array manner. The upper wiring line 35 is connected with a free layer of the TMR 34. An anti-ferromagnetic substance layer of the TMR 34 is connected with the drain of a transistor 37 through a third wiring line 36. The gate of transistor 37 is controlled by read word line W (W1, W2, W3) 39. By flowing current through the two wiring lines B and D, a synthetic magnetic field is generated in the neighborhood of the intersection. The magnetization direction of the free layer is set based on the direction of the current. Thus, the resistance value of the TMR 34 can be changed.

FIG. 3 shows an example of the synthetic magnetic field condition when the magnetic reversal in this example is caused. Referring to FIG. 3, the following is described. That is, the magnetic reversal does not occur by only one magnetic field. There are condition areas (Write "0", Write "1") for the magnetic reversal using the synthetic magnetic field. Even if a writing operation is carried out to the TMR arranged at the intersection of the two wiring lines using this condition, the magnetic reversal does not occur because the magnetic field of one axis is applied only to the TMRs other than the TMR at the intersection. It should be noted that when a reading operation of the data from the TMR 34 is carried out, the transistor 37 connected with the TMR 34 is set to the ON state using a wiring line W to apply voltage to the TMR 34 through the wiring line B. The resistance value of the TMR is evaluated based on the flowing current.

However, in the memory device in which the conventional magnetic resistance elements are arranged in an array manner, the magnetization states of adjacent magnetic substance elements change by the magnetic field of the wiring line when the writing operation is carried out to the magnetic substance element. As a result, there is a possibility that the data cannot be read out, and the data is changed. This phenomenon will be described with reference to the figures.

Supposing that a weak magnetic field of a degree that the magnetization does not reverse is repeatedly applied to the magnetized magnetic substance in an opposite direction to the magnetization direction, the magnetization state is destroyed. Such a phenomenon is mentioned in "Magnetic Engineering Lecture 5 Magnetic Thin Film Engineering" (Maruzen Co., Ltd., P.174). FIG. 4 shows a magnetic field condition when the magnetization state changes by applying a magnetic field to the easy axis and the hard axis of the magnetized magnetic substance. Also, FIG. 4 shows the dependence on the number of times when the magnetic field weaker than the magnetic field necessary for the magnetic reversal is repeatedly applied to the hard axis.

In this reference, a case is described that a sine wave magnetic field with the frequency of 1 kHz and the amplitude of 1.0 Oe is applied $10^5$ cycles to the magnetic substance in the hard axis. In this case, the applied magnetic field is about 30 percent of the magnetic coercive force of 3.2 Oe of the magnetic substance, and the magnetization of the magnetic substance has reversed almost fully when the magnetic field 2.0 Oe is applied to the hard axis of the magnetic substance after the above repetitive application of the weak magnetic field. Also, in case that the magnetic fields are applied to both of the easy axis and the hard axis, the application of the magnetic field of 1.5 Oe to the hard axis causes the magnetization reversal when the magnetic field of 0.8 Oe is applied to the easy axis. Specifically, when the magnetic field of 2.0 Oe is applied to the easy axis using a bit line and the magnetic field of 2.0 Oe is applied to the hard axis using a word line, a synthetic magnetic field at the intersection of the bit line and the word line exceeds a critical magnetic field to cause the magnetic reversal. Thus, the magnetic reversal is not caused in an adjacent magnetic substance apart from the intersection and a writing operation can be carried out correctly. In this case, however, when the magnetic field of 1.0 Oe, which is a half of the writing magnetic field, is applied to the adjacent magnetic substance $10^5$ times, the magnetic field of 2.0 Oe by the word line changes the magnetization state of the adjacent magnetic substance as mentioned above. In this way, when the number of cycles of the sine wave magnetic field exceeds a predetermined value, the magnetization state is changed with the magnetic field smaller than a static critical magnetic field. Consequently, the reliability of the magnetic memory device reduces remarkably.

In the magnetic memory device at present, the above phenomenon is not a problem because the interval between the word lines or the bit lines is wide so that the magnetic field which reaches an adjacent cell is small. However, when the magnetic memory device would be integrated in a high density in the future so that the interval between the elements is made narrow, it would be not possible to ignore the magnetic field from the adjacent cell.

Also, with the above problem, there is not an appropriate index to set the influence of the magnetic field to the adjacent cell to a desired state. Therefore, the pitch of the magnetic substance elements and the interval between the wiring line and the magnetic substance element cannot be easily set, on the design of the magnetic memory device.

In conjunction with the above description, a high density non-volatile ferromagnetic random access memory is disclosed in Japanese Laid Open Patent application (JP-A-Heisei 9-509775). In this reference, a non-volatile ferromagnetic random access memory element is comprised of first and second ferromagnetic layers. At least one of the first and second ferromagnetic layers has a magnetic moment on a same plane. A non-magnetic metal layer is inserted between the first and second ferromagnetic layers. A first end non-magnetic conductive layer is provided for an end of the ferromagnetic random access memory element. A second end non-magnetic conductive layer is provided for an opposite end to the above end in the ferromagnetic random access memory element. A second end conductive layer is provided to be perpendicular to the magnetic moment of at least one of the first and second ferromagnetic layers and to limit a conductive path through which current flows from the first magnetic layer to the second magnetic layer via the non-magnetic metal layers.

Also, a magnetic memory device is disclosed in Japanese Laid Open Patent application (JP-A-Heisei 10-177783). In the magnetic memory device of this reference, the difference between two or more ferromagnetic substance layers stacked via non-magnetic layers in the direction of magnetization is stored as data. The difference in the direction of the magnetization is read out as a resistance value. A first data storage section is provided on a substrate and a second data storage section is provided adjacent to the first data storage section. A magnetic field forming electrode is provided adjacent to the first and second data storage sections to apply the magnetic fields of opposite directions to the first and second data storage sections at the same time. The magnetic field forming electrode is provided on the first data storage section through a first insulating film, and the second data storage section is provided on the magnetic field forming electrode through a second insulating film.

Also, a magnetic memory device is disclosed in Japanese Laid Open Patent Application (JP-P2000-106462A). In this reference, the magnetic memory has a ferromagnetic tunnel junction structure of ferromagnetic layer/tunnel barrier layer/ferromagnetic layer or ferromagnetic double tunnel junction structure of ferromagnetic layer/tunnel barrier layer/ferromagnetic layer/tunnel barrier layer/ferromagnetic layer. The tunnel resistance of the magnetic memory device changes, depending on a relative angle between magnetization directions of the ferromagnetic layers. The magnetic memory device has a magnetic resistance ratio which increases with a positive inclination in accordance with the increase of a bias voltage. Also, the decrease of the magnetic resistance ratio which accompanies the rise of the temperature is small. In the tunnel barrier layer, the value of $S/(\Phi)^{1/2}$ meets $10 \leq S/(\Phi)^{1/2}$, when tunnel barrier height is $\Phi$ [eV], and tunnel barrier width is S [angstroms].

Also, a quantum random address memory is disclosed in Japanese Laid Open Patent Application (JP-P2000-285669A). In this reference, the quantum random address memory is comprised of a plurality of address ports which give a plurality of addresses in a low dimension, a data output section, a plurality of magnetic nano-memory elements, and a plurality of non-linear mixer elements arranged quasi-randomly to combine a one side portion of the plurality of address ports and the data output section to the plurality of magnetic nano-memory elements in a high dimension. An other side portion of the plurality of address ports and the data output section are combined with the plurality of magnetic nano-memory elements, and the plurality of magnetic nano-memory elements are larger than the plurality of addresses in the low dimension.

SUMMARY OF THE INVENTION

Therefore, an object of the present invention is to provide a magnetic memory device and a method of designing the magnetic memory device, in which an index to evaluate the influence of a magnetic field to a neighbor cell can be given.

Another object of the present invention is to provide a magnetic memory device and a method of designing the magnetic memory device, in which the memory characteristic can be kept even if magnetic substance elements are arranged in a high density.

In an aspect of the present invention, a magnetic memory device includes a plurality of word lines extending into a first direction, a plurality of bit lines extending into a second direction to intersect the plurality of word lines, and a plurality of magnetic memory cells which are provided at intersections of the plurality of word lines and the plurality of bit lines, and each of which includes a ferromagnetic film. Data is written in a first one of the plurality of magnetic memory cells with a synthetic magnetic field generated by first current flowing on a specific one of the plurality of word lines associated with the first magnetic memory cell and second current flowing on a specific one of the plurality of bit lines associated with the first magnetic memory cell. At this time, a distance d between the magnetic memory cell and one of the specific word line or the specific bit line meets the following equation (1), $$d \leq p \times (\gamma/(1-\gamma))^{1/2} (0 < \gamma < 1) \tag{1}$$

where p is a distance between the first magnetic memory cell and a second magnetic memory cell adjacent to the first magnetic memory cell in a specific one of the first direction and the second direction, and γ is a strength ratio of a component of the synthetic magnetic field in the specific direction in the second magnetic memory cell.

Here, it is desirable that an easy axis of the first magnetic memory cell is in the first direction.

Also, the distance d is desirably defined based on a center position of the ferromagnetic film and a center of a current distribution in one of the specific wiring line and the specific bit line.

Also, it is desirable that the distance p between the first magnetic memory cell and the second magnetic memory cell is equal to or less than 1 μm.

Also, it is desirable that the distance p between the first magnetic memory cell and the second magnetic memory cell is equal to or less than 1 μm, and the γ is equal to or less than 0.3.

In another aspect of the present invention, a magnetic memory device includes a plurality of write word lines extending into a first direction, a plurality of read word lines extending into the first direction in parallel to the plurality of write word lines, a plurality of bit lines extending into a second direction to intersect the plurality of write word lines, and a plurality of magnetic memory cells which are provided at intersections of the plurality of word lines and the plurality of bit lines, and each of which includes a ferromagnetic film and a conductive drawing line connected with a corresponding one of the plurality of read word lines. Data are written in accessed magnetic memory cells as first ones of the plurality of magnetic memory cells with synthetic magnetic fields, each of which is generated by first current flowing on one of the plurality of write word lines associated with a corresponding one of the accessed magnetic memory cells and second current flowing on one of the plurality of bit lines associated with the corresponding accessed magnetic memory cell. At this time, a distance d between an end-side one of the accessed magnetic memory cells and one of the associated write word line or the associated bit line meets the following equation (2), $$d \leq p \times (\gamma/(1-\gamma))^{1/2} \quad (0 < \gamma < 1) \qquad (2)$$

where p is a distance between the end-side accessed magnetic memory cell and a non-accessed one of the plurality of magnetic memory cells adjacent to the end-side accessed magnetic memory cell in a specific one of the first direction and the second direction, and γ is a strength ratio of a component of the synthetic magnetic field in the specific direction in the non-accessed magnetic memory cell.

Here, it is desirable that an easy axis of the accessed magnetic memory cell is in the first direction.

Also, the distance d is desirably defined based on a center position of the ferromagnetic film of the end-side magnetic memory cell and a center of a current distribution in one of the write wiring line associated with the end-side magnetic memory cell and the bit line associated with the end-side magnetic memory cell.

Also, the distance p between the end-side accessed magnetic memory cell and the non-accessed magnetic memory cell may be equal to or less than 1 μm.

Also, the distance p between the end-side accessed magnetic memory cell and the non-accessed magnetic memory cell may be equal to or less than 1 μm, and the γ may be equal to or less than 0.3.

Also, a first wiring line pitch between the bit lines corresponding to the accessed magnetic memory cells may be different from a second wiring line pitch between the end-side accessed magnetic memory cell and the non-accessed magnetic memory cell. In this case, the first wiring line pitch is desirably smaller than the second wiring line pitch.

BRIEF DESCRIPTION OF THE DRAWINGS

FIG. 14 is a plan view showing the structure of the magnetic memory device according to the second embodiment of the present invention.

DESCRIPTION OF THE PREFERRED EMBODIMENTS

Hereinafter, a magnetic memory device of the present invention will be described below in detail with reference to the attached drawings.

Figure 1:
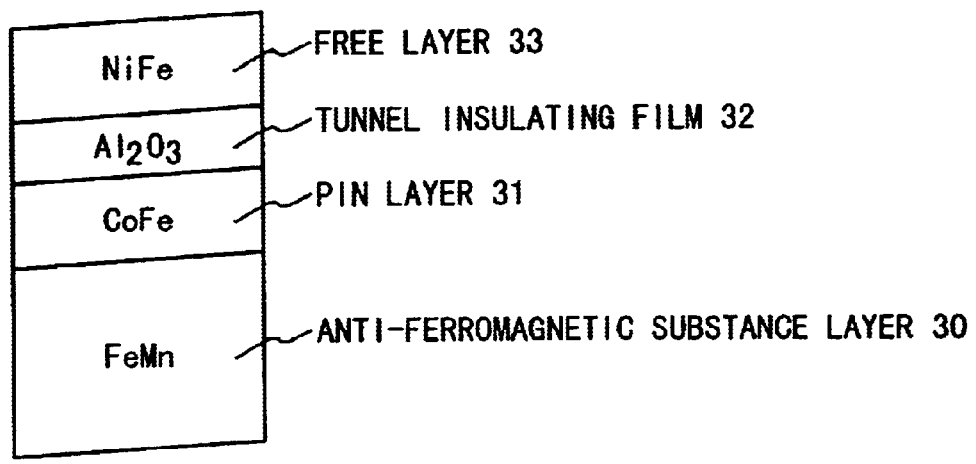
FIG. 1 is a cross sectional view schematically showing a magnetic memory element of a conventional magnetic memory device.
Figure 2:
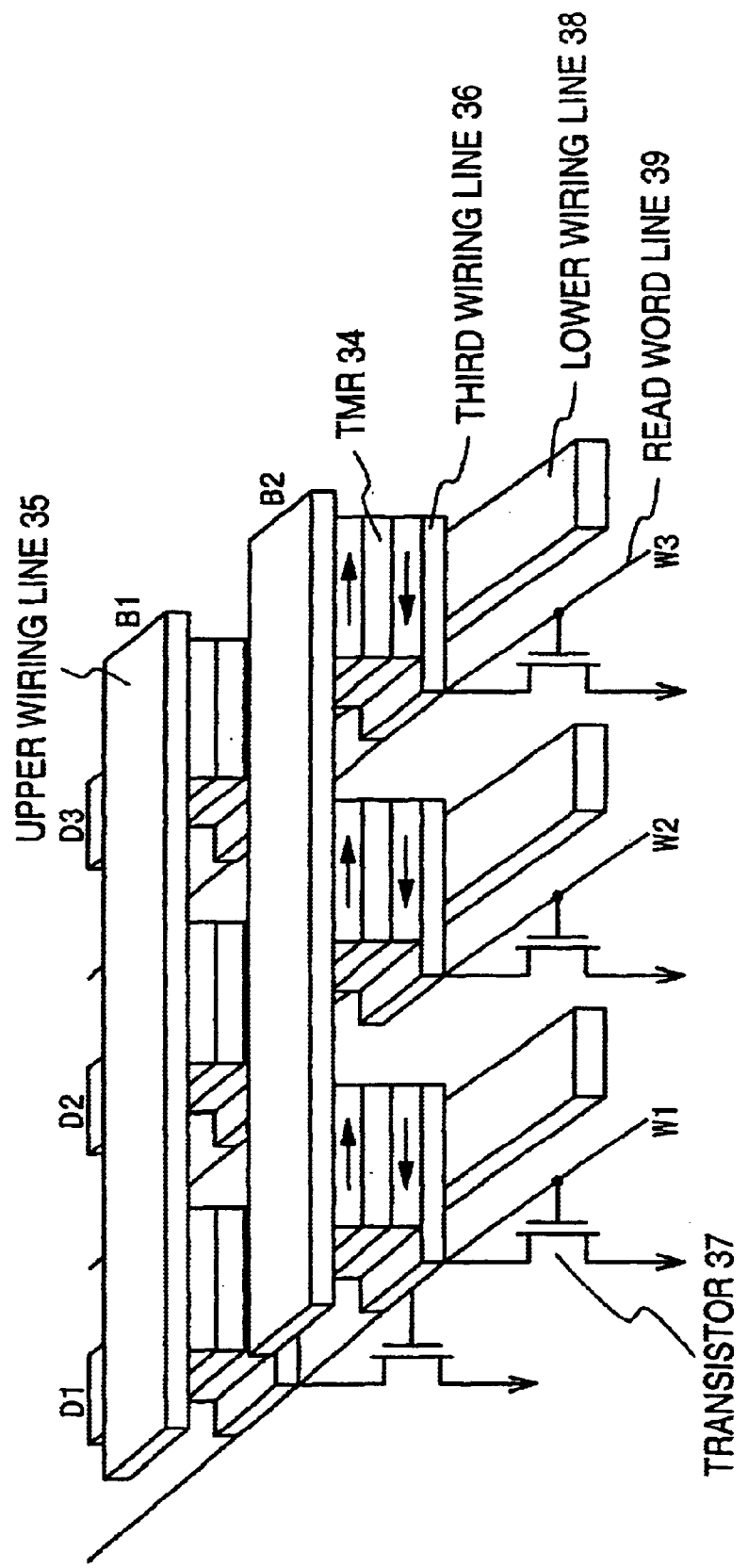
FIG. 2 is a perspective view showing the conventional magnetic memory device.
Figure 3:
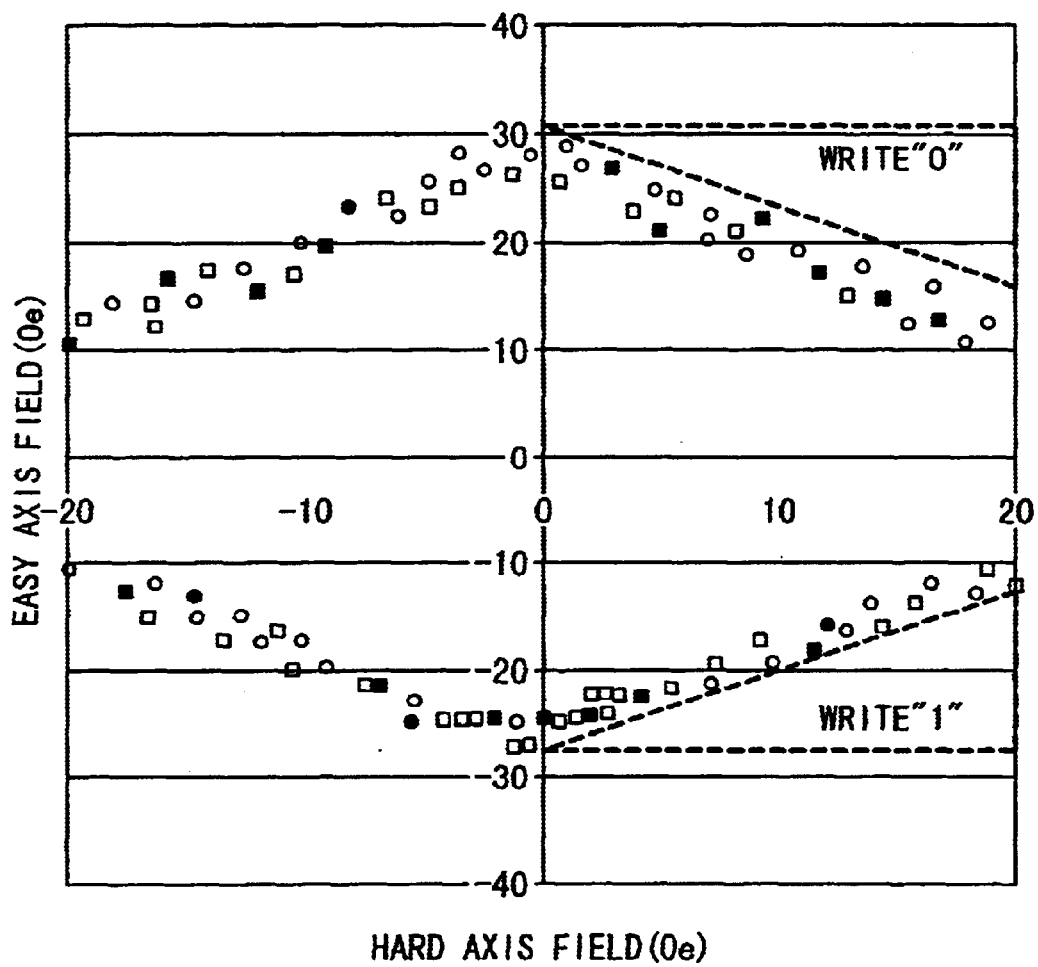
FIG. 3 is a diagram showing a measurement result showing magnetic reversal condition in the conventional magnetic memory device.
Figure 4:
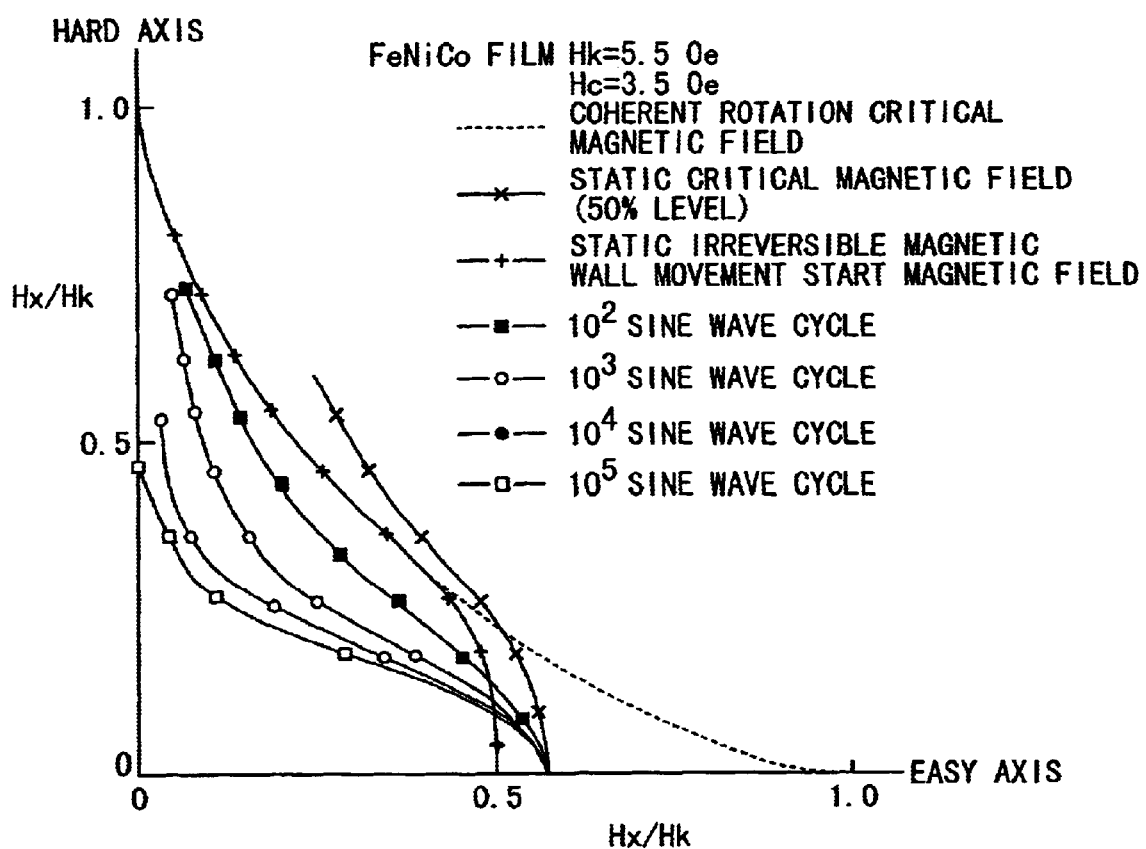
FIG. 4 is a graph showing a measurement result of dependence of the magnetic reversal on the number of times of application of a magnetic field in the conventional magnetic memory device.
Figure 5:
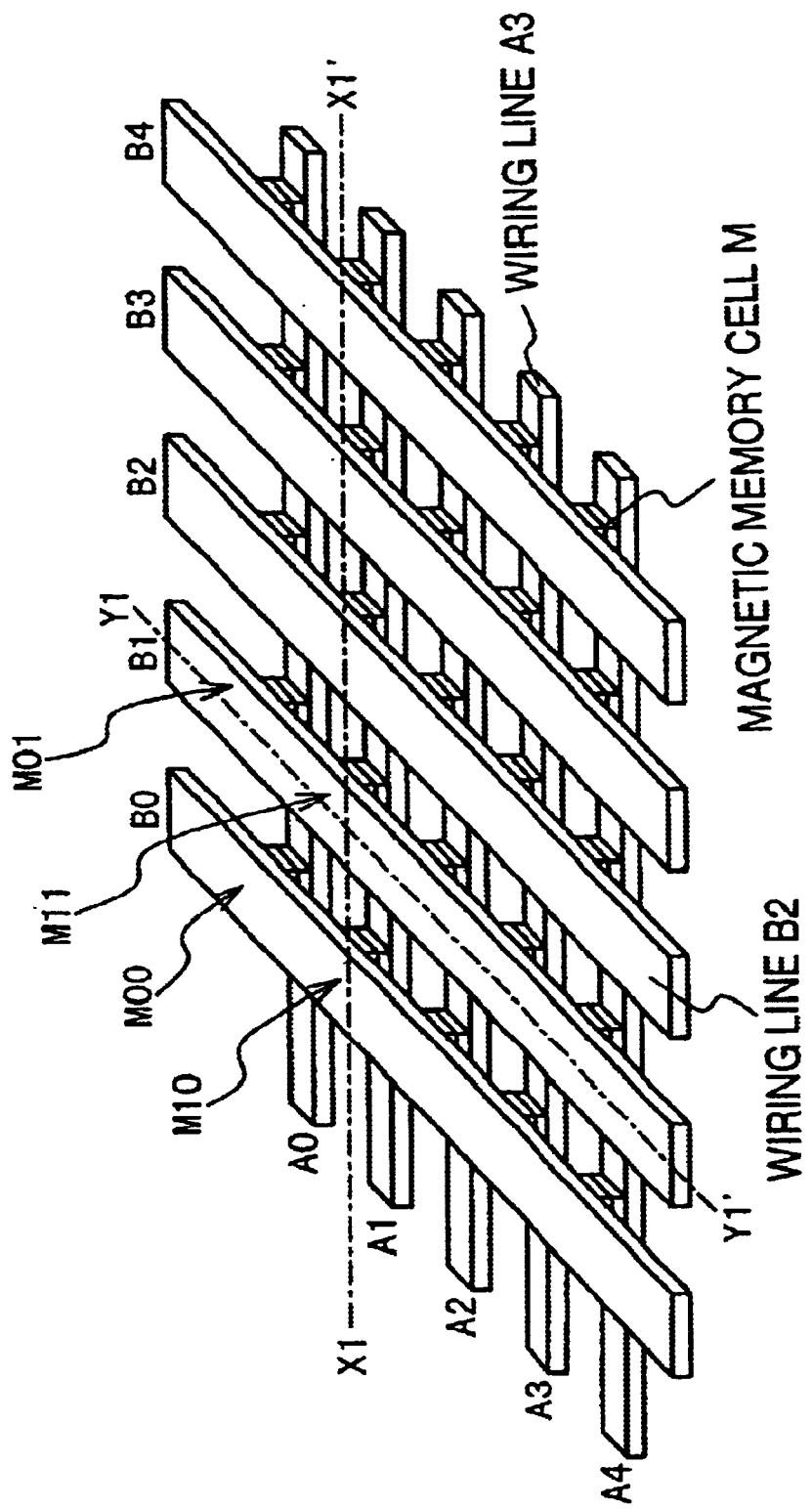
FIG. 5 is a perspective view showing the structure of a magnetic memory device of the present invention.
Figure 6A:
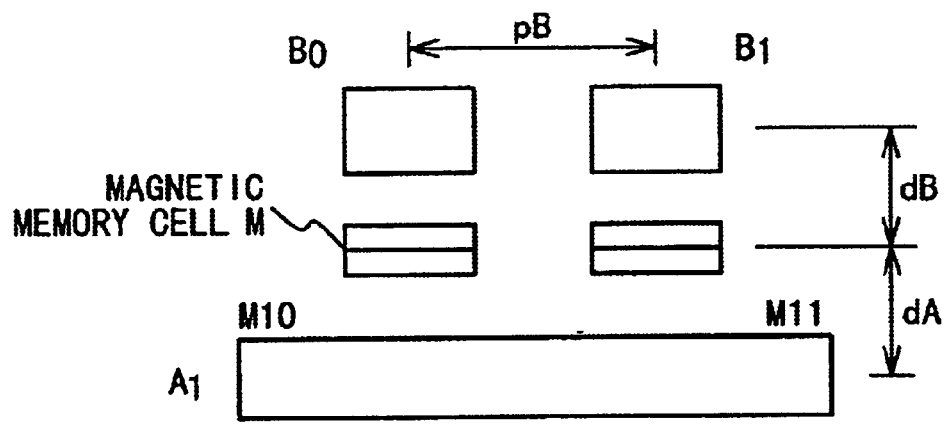
FIGS. 6A and 6B are cross sectional views of the main portion of the magnetic memory device according to the first embodiment of the present invention along the line X1–X1' and the line Y1–Y1'.
Figure 6B:
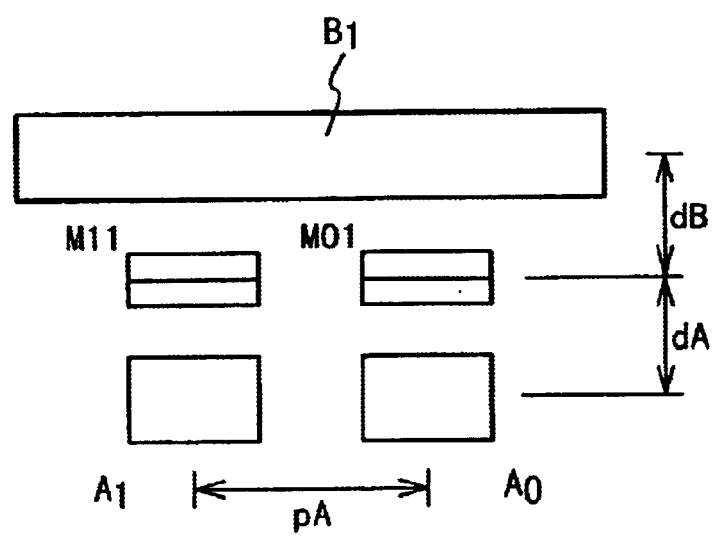
Figure 7:
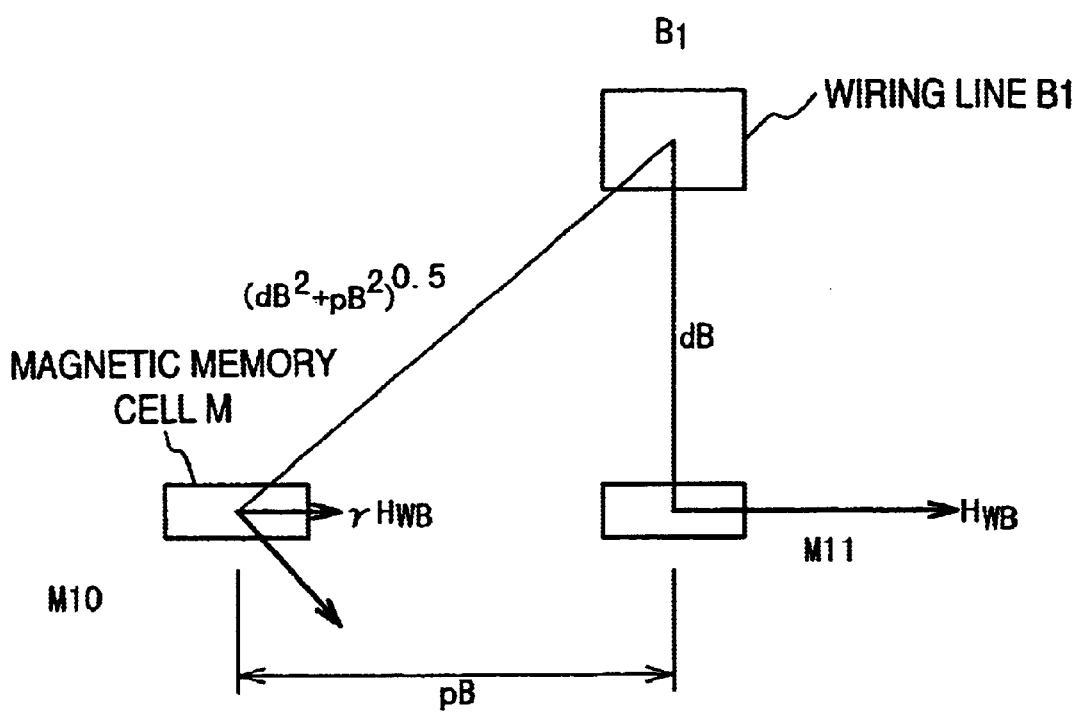
FIG. 7 is a schematic diagram showing the magnetic field strength around a wiring line in the magnetic memory device according to the first embodiment of the present invention.
Figure 8:
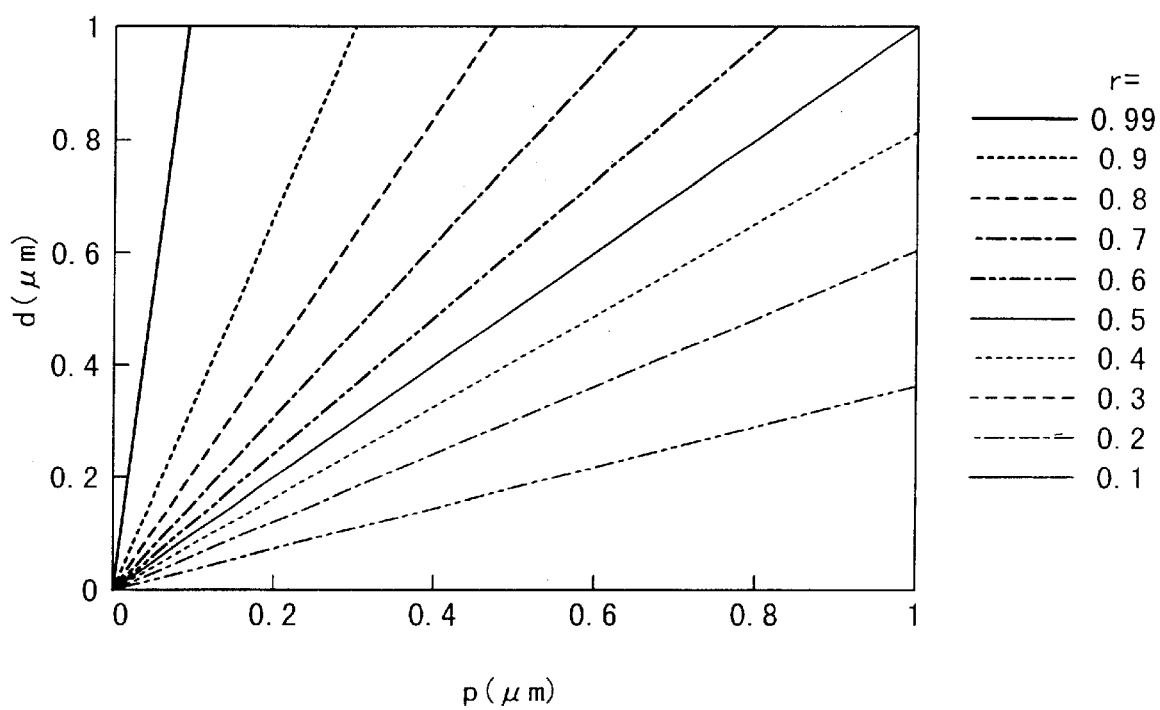
FIG. 8 is a graph showing a calculation result of relation between d and p in the magnetic memory device according to the first embodiment of the present invention.

First, referring to FIG. 5 to FIG. 8, the principle of the magnetic memory device of the present invention will be first described. FIG. 5 is a perspective view showing the overview structure of the magnetic memory device of the present invention. FIGS. 6A and 6B are cross sectional views of the magnetic memory device of the present invention along the line X1–X1' and the Y1–Y1' line in FIG. 5. FIG. 7 is a schematic diagram showing the magnetic field strength around a wiring line in the magnetic memory device according to the first embodiment of the present invention. FIG. 8 a graph showing a calculation result of relation between d and p in the magnetic memory device according to the first embodiment of the present invention;

As shown in FIG. 5, the magnetic memory device of the present invention is comprised of a plurality of magnetic memory cells M (M00, M01, ..., M10, M11, ...) arranged in a matrix manner, and two write wiring lines A (A0 to A4) and wiring lines B (B0 to B4) in the neighborhood of each magnetic memory cell. It should be noted that the directions of the write wiring lines A and B are orthogonal to each other.

As shown in FIGS. 6A and 6B, the arrangement pitch of the magnetic memory cells is pB in the direction to which the wiring line A extends and the distance in a thickness direction the between the center of the wiring line B and the center of a magnetic substance film of the magnetic memory cell M is dB. The pitch dB is set to meet the condition shown in the following equation (1) in the magnetic memory device. It should be noted that, $\gamma$ is a value larger than 0 and smaller than 1.

$$dB \leq pB(\gamma/(1-\gamma))^{1/2} \quad (1)$$

Also, the arrangement pitch of the magnetic memory cells is pA in the direction to which the wiring line B extends and the distance in a thickness direction the between the center of the wiring line A and the center of a magnetic substance film of the magnetic memory cell M is dA. The pitch dA is set to meet the condition shown in the following equation (2). The value of $\gamma$ may be different from the value of above-mentioned $\gamma$.

$$dA \leq pA(\gamma/(1-\gamma))^{1/2} \quad (2)$$

It should be noted that although not illustrated, the magnetic memory device is further comprised of a test section for testing the state of the magnetic memory cell changed through the writing operation. It is desirable that the center of the wiring line B is a position where the current flows mainly. Also, it is desirable to analytically determine a current distribution in the wiring line from the structure or shape of the wiring line and the current flowing center.

Next, the operation of the magnetic memory device with the above structure will be described. When the magnetization state of a magnetic memory cell M11 should be changed, currents are supplied to the two write wiring lines A1 and B1 in association with the magnetic memory cell M1 to give the magnetic memory cell M11 a synthetic magnetic field. The currents are controlled for the magnetic memory cell M11 to be set a desired magnetization state in the magnitude and direction of the current and the magnitude and direction of the synthetic magnetic field.

The magnetic memory cell includes a magnetic resistance element like the above-mentioned TMR and a magneto-optics device. Also, the set state is detected by giving electric, optical, or dynamic change to the magnetic memory cell. For example, when voltage or current is applied, another wiring line may be connected with the magnetic memory cell, and may be supplied using the write wiring line. Also, the strength of the reflected wave when light is applied may be detected.

In the above magnetic memory device, it is desirable that the pitches between adjacent magnetic memory cells M and the distances from the magnetic memory cell M to the wiring lines A and B are set to satisfy the relation shown in the above equation (1) and (2). At this time, a quantity of the magnetic field given to the magnetic memory cell by the write wiring line can be set to be equal to or smaller than $\gamma$ times ($\gamma$ is smaller than 1 and can be set to an optional value) of the magnetic field which is originally applied to the magnetic memory cell. Therefore, the possibility of the destruction of the written data can be eliminated.

This will be described with reference to FIG. 7 and FIG. 8. It is, supposed that the write current flows through the wiring line B1 and that the wiring line B1 is sufficiently long. In this case, the magnetic field applied to the magnetic memory cell M is in inverse proportion to the distance from the wiring line B1. As shown in FIG. 7, the ratio of the distance of the magnetic memory cell M11 from the wiring line B1 and the distance of the magnetic memory cell M10 adjacent to the magnetic memory cell M11 from the wiring line B1 is dB:(dB$^2$+pB$^2$)$^{1/2}$. Moreover, when the magnetic field applied to the magnetic memory cell M11 by the wiring line B1 is HwB, a component of the magnetic field applied to the magnetic memory cell M10 in the same direction as HwB has the ratio of dB/(dB$^2$+pB$^2$)$^{1/2}$. From the relations, the ratio $\gamma$ of the magnetic field applied to the magnetic memory cells M11 and the magnetic field applied to the magnetic memory cell M10 is expressed by the following equation (3). The following equation (4) is obtained from the equation (3).

$$\gamma = 1/(1+(pB/dB)^2) \quad (3)$$

$$dB = pB(\gamma/(1-\gamma))^{1/2} \quad (4)$$

Therefore, if the distance dB is set to be equal to or less than pB($\gamma/(1-\gamma)$)$^{1/2}$, the magnetic field applied to the adjacent magnetic memory cell M10 is equal to or less than $\gamma$HwB. The same is true about the wiring line A. By using $\gamma$ as an index, it is possible to easily calculate the pitch between the magnetic memory cells and the distance between the magnetic memory cell and the wiring line when the magnetic field applied to the neighbor magnetic memory cell is less than a predetermined ratio.

FIG. 8 shows relation of the distance d and the pitch p when it is supposed that $\gamma$ is from 0.1 to 0.99. The permissive range of the distance d is in a lower right section of each line. Supposing that the film thickness of the wiring line is 400 nm, that the film thickness of the interlayer insulating film between the wiring line and the magnetic memory cell is 400 nm, and that the thickness of the magnetic memory cell is as small as ignorable, d is 600 nm. In this case, the device arrangement pitch p is 0.92 $\mu$m when the influence to the adjacent magnetic memory cell is 30 percent of Hw, as mentioned above. Also, in order to realize the high integration of the magnetic memory cells with the pitch equal to or smaller than 0.92 $\mu$m while keeping the influence to the adjacent magnetic memory cell to the same level, it is sufficient to change d in accordance with FIG. 8.

In this way, by employing $\gamma$ shown by the equation (3) as an index, it is easily possible to determine the cell pitch and the distance between the cell and the wiring line in such a manner that the influence of the write magnetic field to the adjacent magnetic memory cell is less than $\gamma$ times. The influence of the write magnetic field to the adjacent magnetic memory cell can be restrained below the desired value even if the magnetic memory cells are arranged in a high density. Also, the risk that the written magnetization state is destroyed can be eliminated or improved. Also, the reduction of the chip area of the whole magnetic memory device and the design having high integration can be easily achieved.

Especially, when the magnetic memory cell is integrated in the pitch equal to or less than 1 $\mu$m, the influence of the synthetic magnetic field to the adjacent cell is large. Therefore, it is important to define the distance between the cell and the wiring line in the above expression. Also, it is desirable that the value of $\gamma$ is equal to or less than 0.3 in the magnetic memory cell at present. It is possible to set the value of $\gamma$ to the value near 1 with the improvement of the magnetic memory cell itself.

It should be noted that the relation between the distance dB and the pitch pB is described as above. However, the effect of the improvement may be obtained even if a size limitation is applied to both or one of the distances dA and dB.

Figure 9:
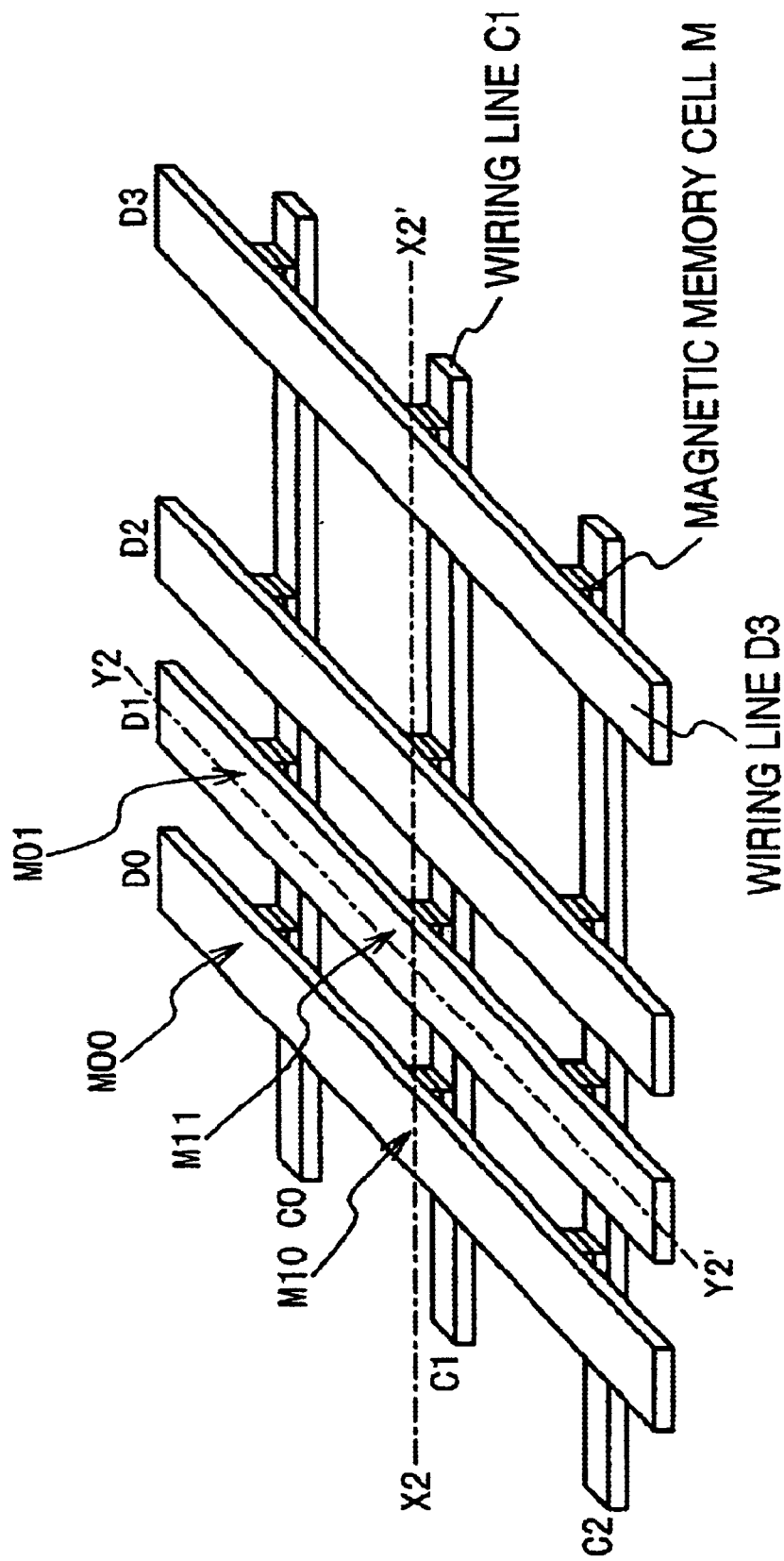
FIG. 9 is a perspective view showing the structure of the magnetic memory device according to a second embodiment of the present invention.
Figure 10A:
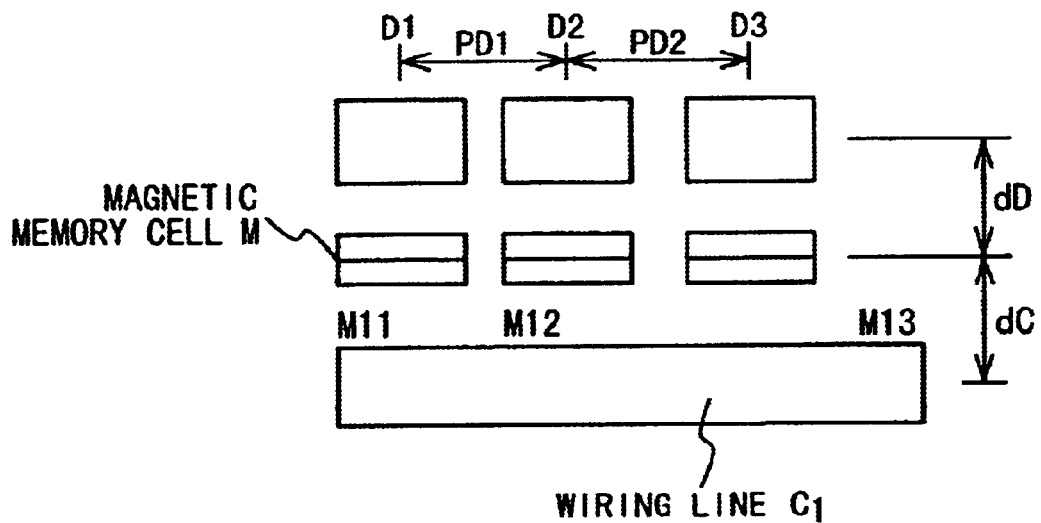
FIGS. 10A and 10B are cross sectional views of the magnetic memory device according to the second embodiment of the present invention along the line X2–X2' and the line Y2–Y2'.
Figure 10B:
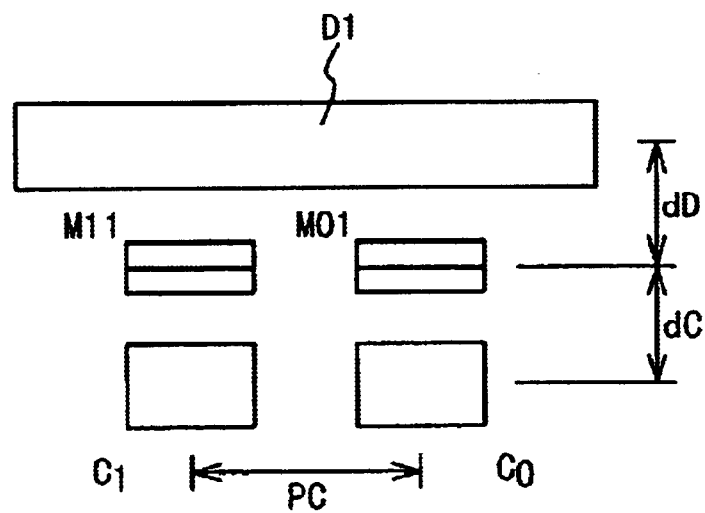

Next, referring to FIG. 9 and FIGS. 10A and 10B, another magnetic memory device of the present invention will be described. FIG. 9 is a perspective view showing the overview structure of the other magnetic memory device. FIGS. 10A and 10B are cross sectional views of the other magnetic memory device along the line X2–X2' and Y2–Y2' of FIG. 9. It should be noted that the other magnetic memory device relates to a writing system in which current is applied to a plurality of continuous wiring lines at the same time.

As shown in FIG. 9, the other magnetic memory device has a plurality of magnetic memory cells M (M00, M01, . . . , M10, M11, M12, M13, . . . ) and write wiring lines C (C0–C2) and D (D0–D3). It should be noted that the directions of the write wiring lines are set to be orthogonal to each other.

As shown in FIGS. 10A and 10B, it is supposed that the arrangement pitch of the adjacent cells in which data are written using the same wiring line D is pC, and the distance in a thickness direction between the center of the wiring line C and the center of a magnetic substance in the magnetic memory cell M is dC. In this case, the distance dC is set to equal to or less than $pC(\gamma/(1-\gamma))^{1/2}$ in the magnetic memory device. It should be noted that $\gamma$ is larger than 0 and smaller than 1. Also, it is supposed that the arrangement pitch of the adjacent cells along the wiring line C is pD, and the distance in a thickness direction between the center of the wiring line D and the center of a magnetic substance in the magnetic memory cell M is dC. In this case, there are one or more kinds of pD. At least one pD2 of the values of pD is set such that dD is equal to or less than $pD2(\gamma/(1-\gamma))^{1/2}$. The value of $\gamma$ may be different from the value of above-mentioned $\gamma$.

It should be noted that although not illustrated, the magnetic memory device has a test section for testing the state of the magnetic memory cell changed through the writing operation. It is desirable that the current center is a portion of the wiring line where current flows mainly. It is desirable to analytically determine current distribution in the wiring line from the structure and shape of the wiring line and to determine the center of the current.

Next, the operation of the magnetic memory device will be described. When the magnetization states of the magnetic memory cells M10 to M13 which are continuously arranged on a line should be changed, currents are applied to the write wiring lines C1 and D0 to D3 in association with the magnetic memory cells M10 to M13 to apply synthetic magnetic field to the magnetic memory cells M10 to M13. The synthetic magnetic field is set based on the magnitude and direction of the current and the direction of the write wiring lines to set the magnetic memory cells to desired magnetization states. In this case, the writing operation is carried out to the magnetic memory cells M10 to M12. When there are the magnetic memory cells outside of M10 and M12, the distance dD is in the relation in which dD is equal to or less than $pD2(\gamma/(1-\gamma))^{1/2}$, if the pitch between the cells is pD2. Also, the magnetization state of the magnetic memory cell is determined in the same way as the above-described example.

In this way, like the above-described example, by using $\gamma$ as an index, it is possible to easily determine the cell pitch and the distance between the cell and the wiring line to restrain the influence of the writing magnetic field to the adjacent magnetic memory cell below $\gamma$ times. The influence of the write magnetic field to the adjacent magnetic memory cell can be restrained below the desired value even if the magnetic memory cells are arranged in high density. The possibility of the destruction of the written magnetization state can be reduced. Also, the magnetic memory cells which are arranged continuously in line, and written with the wiring line D through which current flows are applied with the write magnetic field and the writing operation is carried out.

It should be noted that it is possible to exchange relation of the wiring lines C and D and to apply the above-mentioned limitation on the wiring line D to both of C and D.

Figure 11:
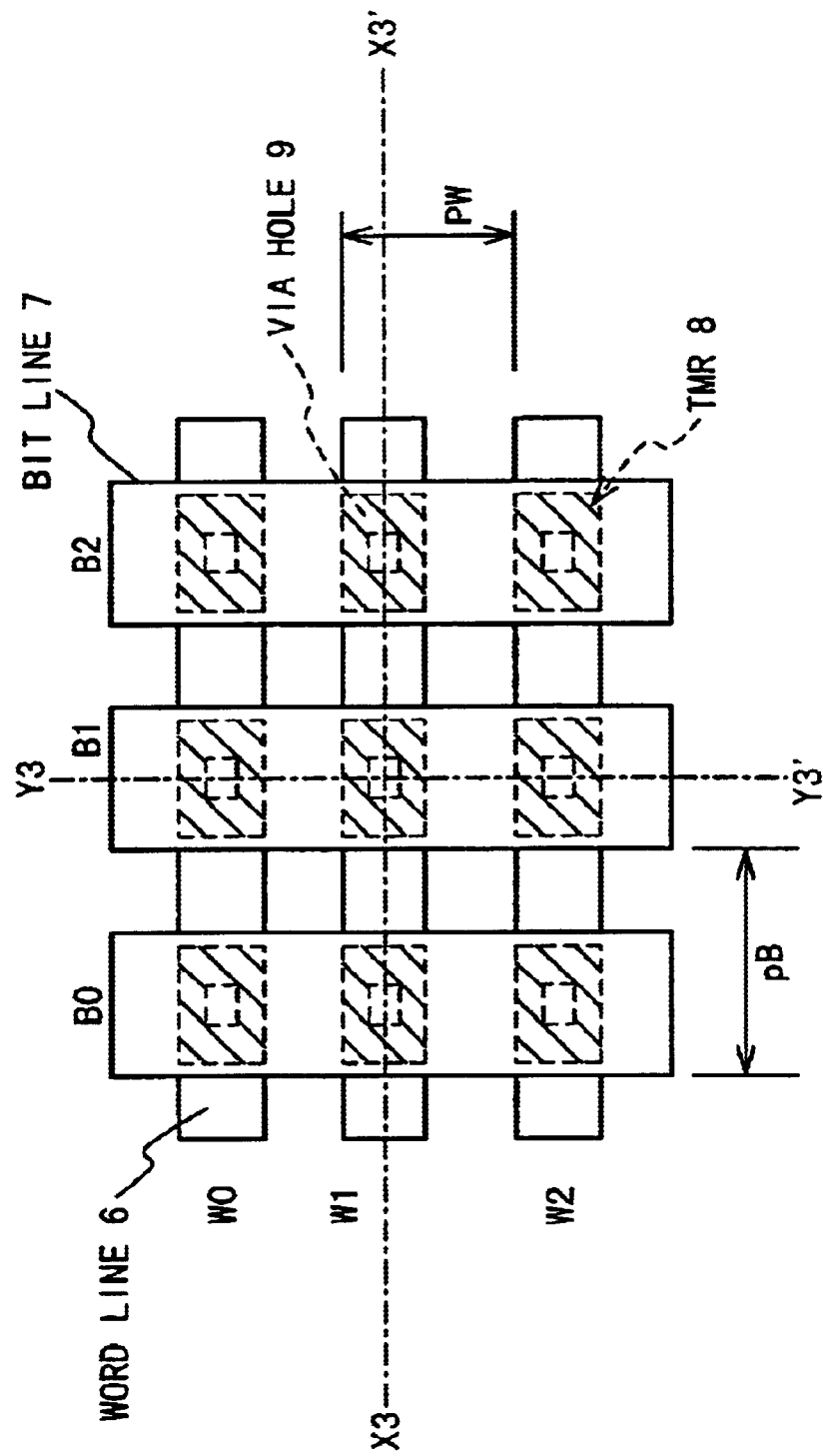
FIG. 11 is a plan view showing the structure of the magnetic memory device according to the first embodiment of the present invention.
Figure 12A:
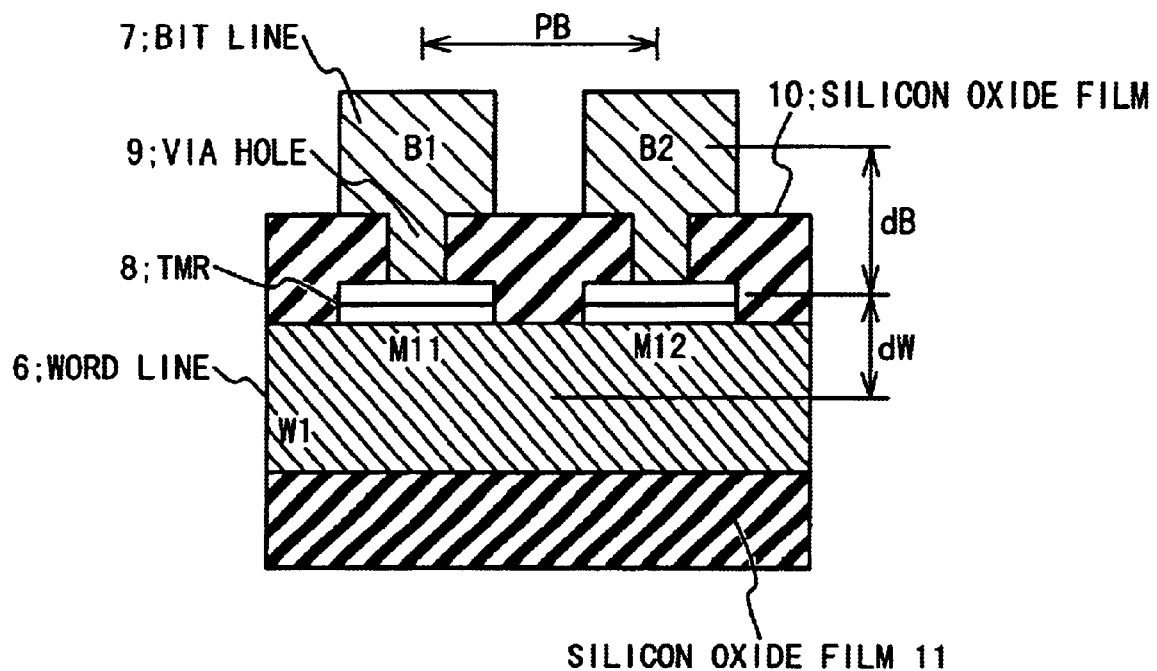
FIGS. 12A and 12B are cross sectional views of the magnetic memory device according to the first embodiment of the present invention along the line X3–X3' and the line Y3–Y3'.
Figure 12B:
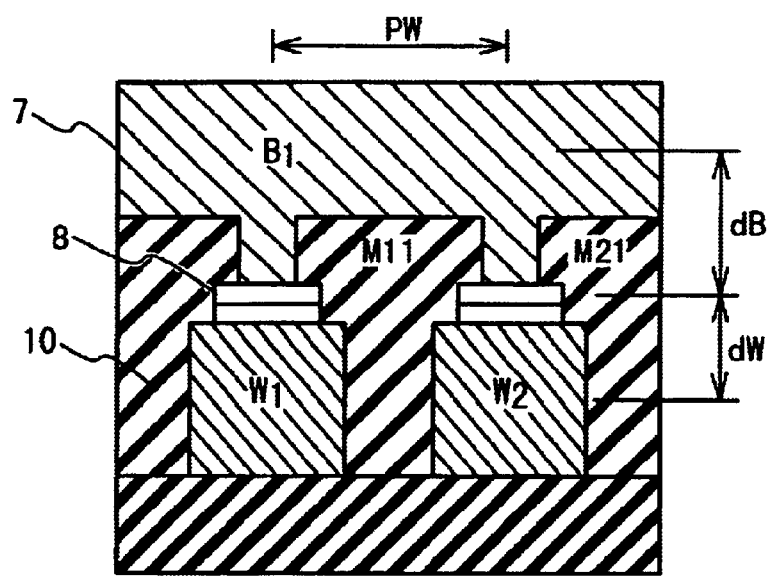
Figure 13:
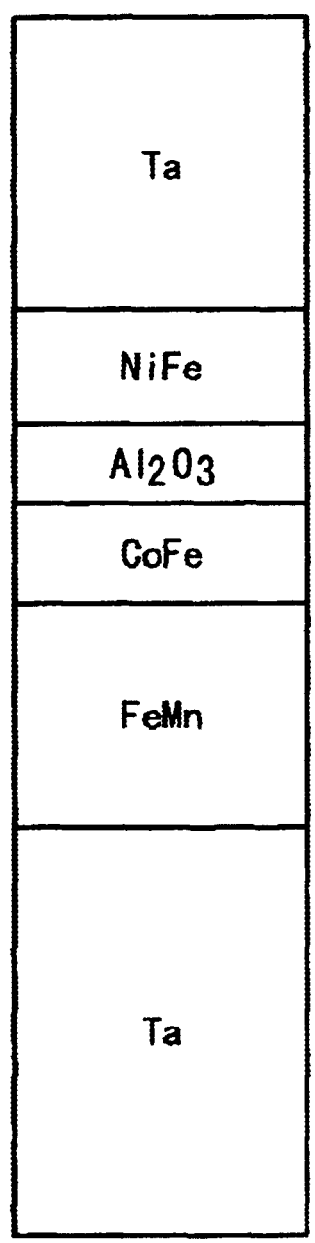
FIG. 13 is a cross sectional view of a TMR element of the magnetic memory device according to the first embodiment of the present invention.

The magnetic memory device according to the first embodiment of the present invention will be described below in detail with reference to FIG. 11 to FIG. 13. FIG. 11 is a plan view showing the structure of the magnetic memory device according to the first embodiment of the present invention. FIGS. 12A and 12B are cross sectional views of the magnetic memory device along the line X3–X3' and the line Y3–Y3' in FIG. 11. Also, FIG. 13 is a cross sectional view showing the structure of the TMR section.

As shown in FIG. 11, the magnetic memory device in the first embodiment has word lines (W0, W1, W2) 6, bit lines (B0, B1, B2) 7, and TMRs 8. The TMR 8 is formed at the intersection section of the word line 6 and the bit line 7. Also, the bit line 7 and the TMR 8 are electrically connected through a via-hole 9.

An example of a manufacturing method of the magnetic memory device of the above structure will be described with reference to FIGS. 12A and 12B. In the magnetic memory device in the first embodiment, after elements such as transistors and wiring lines are formed (not shown) on a silicon substrate, a silicon oxide film 11 is formed by a plasma CVD method and is flattened by a chemical machine polish (CMP). Then, a Ti film (100 nm), a TiN film (300 nm), and an AlSiCu film (500 nm) are continuously formed by a sputtering method.

Subsequently, after a Ta film (20 nm), a FeMn film (10 nm), a CoFe film (2.4 nm), and an Al film (1.5 nm) are formed by the sputtering method, the substrate is kept in the oxygen atmosphere to oxidize the Al film. Then, a NiFe film (5 nm) and a Ta film (40 nm) are formed by the sputtering method. After that, a resist layer is applied and a part of the resist layer is left for the TMR 8 through baking, exposure, and development. The TMR 8 with the structure shown in FIG. 13 is formed by processing the films of Ta, NiFe, AlO, CoFe, and FeMn by a milling method.

Next, the resist layer is removed with organic solvent, and then a resist layer is formed again to have the word line 6 shape by the above-mentioned photoresist technique. The films of Ta, AlSiCu, TiN, and Ti are processed by the milling method to form the word line 6. Then, after the resist layer is removed with organic solvent, a silicon oxide film 10 is formed to have the film thickness of 800 nm by the sputtering method on the whole surface. Then, the silicon oxide film is flattened by the CMP and the 150-nm silicon oxide film 10 is left on the TMR 8. Next, via-holes 9 are formed by the photoresist technique and the dry etching technique. A resist layer is removed by ashing, and then the films of Ti, TiN, AlSiCu and TiN are formed by the sputtering method, and the bit lines 7 are formed by the photoresist technique and the dry etching technique.

Next, the operation of the magnetic memory device manufactured by the above method will be described. The magnetic memory device in the first embodiment is a nonvolatile memory having TMRs as a memory element.

Also, each of the TMRs 8 has anisotropic property in shape, and the direction of the word line 6 is an easy axis.

First, the writing operation of data will be described. It is supposed that current is applied through the word line W1 and current that is applied to the bit line B1 in the direction corresponding to data. Thus, a synthetic magnetic field is applied to the TMR 8 at the intersection of the word line W1 and the bit line B1 and a free layer (the NiFe film of FIG. 13) is magnetized in accordance with the direction of the current on the bit line 7. After the current is stopped, the direction of the magnetization is kept because the free layer is ferroelectric.

Next, the reading operation of the data will be described. The bit line B1 is set to a floating state and is connected with an integrating circuit (not shown), and the voltage of 0.5 V is applied to the word line W1. The other wiring lines are grounded. Because the TMR 8 at the intersection of the word line W1 and the bit line B1 has a changed resistance value depending on the direction of the magnetization, the current quantity flowing into the integrating circuit is different. Then, the direction of the magnetization is determined by comparing with a reference voltage after integrating for time and the written data can be read.

It should be noted that in the first embodiment, the arrangement pitch pW of the word line 6 is 0.6 μm, the word line width is 0.3 μm, the arrangement pitch pB of the bit line 7 is 0.8 μm, the bit line width is 0.5 μm and the size of the TMR 8 is 0.45 μm×0.25 μm. The thickness of the word line 6 is about 500 nm and the distance dW from the center of the word line 6 to the center of the free layer of the TMR 8 is about 283 nm. The thickness of the silicon oxide film 10 as an interlayer insulating film on the TMR 8 is 150 nm and the thickness of the bit line 7 is 400 nm. It is valid to consider that the center of the current is on the center of the interlayer insulating film because the current hardly passes the via-hole 9 when the current flows through the bit line 7. Therefore, the distance dB between the center of the bit line 7 and the center of the free layer of the TMR 8 becomes about 397 nm. In this example, the word line and the bit line of influence to the adjacent cell are designed in such a manner that γ is about 0.2, using FIG. 8.

The writing/reading operation is carried out repeatedly using the magnetic memory device of the above structure. In this case, because the influence of the magnetic field on the adjacent cell is restrained, phenomena such as the written magnetization state being destroyed are not absolutely brought about. By using the index γ of the present invention, the influence of the magnetic field can be easily set to a desired rate.

Figure 15A:
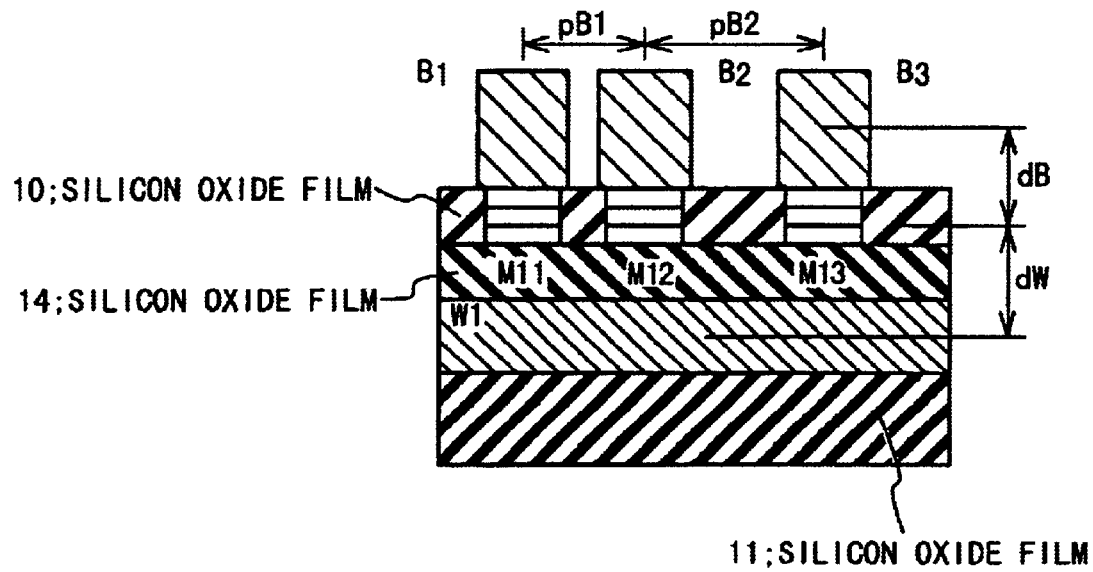
FIGS. 15A and 15B are cross sectional views of the magnetic memory device according to the second embodiment of the present invention along the line X4–X4' and the line Y4–Y4'.
Figure 15B:
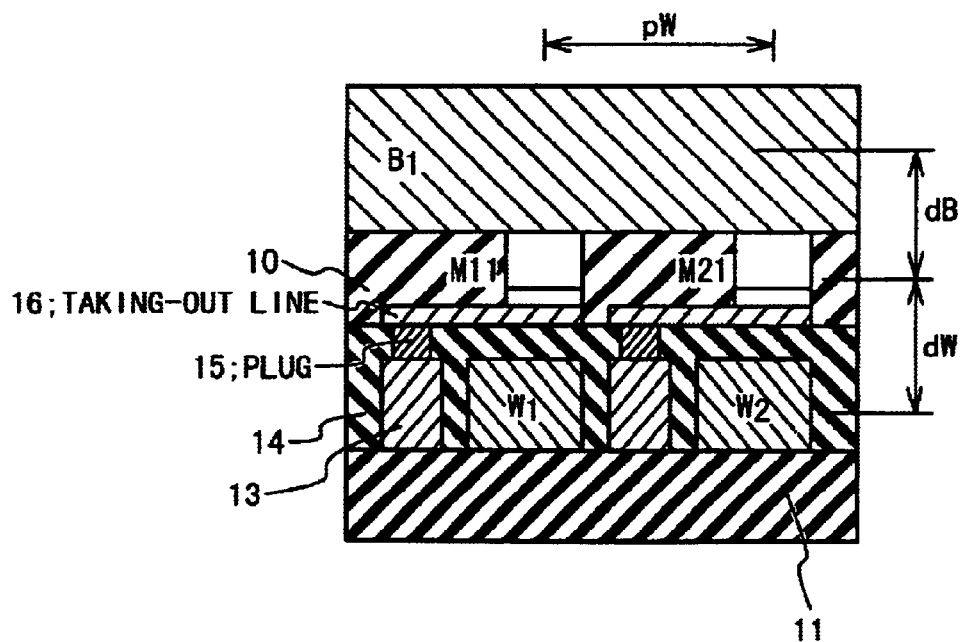

Next, the magnetic memory device according to the second embodiment of the present invention will be described with reference to FIG. 14 and FIGS. 15A and 15B. FIG. 14 is a plan view showing the structure of the magnetic memory device according to the second embodiment of the present invention. FIGS. 15A and 15B are cross sectional views of the magnetic memory device along the line X4–X4' and the line Y4–Y4' in FIG. 14.

As shown in FIG. 14, the magnetic memory device in the second embodiment has write word lines (W0, W1, W2) 12, read word lines 13, bit lines (B1, B2, B3, B4) 7, and the TMRs 8 as memory cells. The TMR 8 is formed at the intersection of the write word line 12 and the bit line 7. The bit line 7 and one electrode of the TMR 8 are electrically connected, the other electrode of the TMR 8 is connected with the drain of a transistor (not shown) through a plug 15, a drawing line 16 and the read word line 13. The source of the transistor is grounded. Also, the gate of the transistor is connected with the read word line 13. The structure of the TMR 8 is the same as FIG. 9.

An example of the manufacturing method of the magnetic memory device of the above structure will be described. In the magnetic memory device in the second embodiment, after the elements such as the transistors and the wiring lines are formed on the silicon substrate, a silicon oxide film 11 is formed by a plasma CVD method. The silicon oxide film 11 is flattened by a chemical machine polish (CMP). After that, the films of Ti (100 nm), TiN (300 nm), AlSiCu (500 nm), and TiN (200 nm) are continuously formed by the sputtering method. The write word line 12 and the read word line 13 are formed by the photoresist technique and the dry etching technique. Then, the silicon oxide film 14 is formed by the plasma CVD method on the whole surface. After the silicon oxide film 14 is flattened by the CMP to leave the silicon oxide film 14 with the film thickness of 200 nm on the word line, the via-hole is formed on the read word line 13 by the photoresist technique and the dry etching technique. Then, the tungsten plug 15 is formed in the via-hole by etching back a tungsten film after the tungsten film is formed on the whole surface.

Next, after the films of Ta (50 nm), FeMn (10 nm), CoFe (2.4 nm), and Al (1.5 nm) are formed by the sputtering method on the whole surface, the substrate is kept in the oxygen atmosphere, to oxidize the Al film. Thereafter, the films of NiFe (5 nm) and Ta (100 nm) are formed by the sputtering method on the oxidized Al film. After that, a resist layer is applied and baked and left to have the shape of the TMR 8 through exposure and development. The films of Ta, NiFe, AlO, CoFe, and FeMn are processed by the milling method to form the TMR 8.

Next, after the resist layer is removed with organic solvent, a resist layer is formed again to have the shape of the drawing line 16 by the above-mentioned photoresist technique, and the Ta film is processed by the milling method. Then, the silicon oxide film 10 is formed by the sputtering method on the whole surface to have the film thickness of 800 nm after the resist layer is removed with organic solvent. The silicon oxide film 10 is flattened by the CMP method to expose the Ta film on the TMR 8. After that, the films of Ti, TiN, AlSiCu, and TiN are formed by the sputtering method, and the bit line 7 is formed by the photoresist technique and the dry etching technique.

Next, the operation of the magnetic memory device will be described. The magnetic memory device in the second embodiment is a nonvolatile memory having the TMR as the memory element. Each of the TMRs 8 is anisotropic in shape, and the direction of the write word line 12 is an easy axis.

First, the writing operation of data will be described. When the current is applied to the write word line W1, and the current in the direction corresponding to the data is applied to the bit lines B1 and B2. Thus, a synthetic magnetic field is applied to the two TMRs at the intersections, and the free layer of the TMR is magnetized in accordance with the current flowing direction on the bit line. After the current is stopped, the direction of the magnetization is kept because the free layer is ferroelectric.

Next, the reading operation of the data will be described. A voltage is applied to the bit lines B1 and B2 to set them to a floating state. A voltage is applied to the read word line and the transistors of the read cells are set to an ON state. The speed of the potential change of the bit line is different because the resistance value of the TMR depends on the stored data. Therefore, by comparing the potential on the bit line with a reference potential after a time period, the direction of the magnetization can be determined and the written data can be read.

It should be noted that in the second embodiment, the arrangement pitch pW of the write word line 12 is 1.2 μm, the word line width is 0.3 μm, the arrangement pitch pB1 of the bit line 7 is 0.6 μm, the arrangement pitch pB2 is 0.8 μm, the bit line width is 0.35 μm and the size of the TMR 8 is 0.25 μm×0.3 μm. The thickness of the write word line 12 is 500 nm and the distance dW from the center of the write word line 12 to the center of the free layer of the TMR 8 is about 514 nm. The thickness of the bit line 7 is 400 nm and the distance dB between the center of the bit line 7 and the center of the free layer of the TMR 8 is about 307 nm. It could be seen from FIG. 8 that γ indicating the influence of the word line and the bit line to the adjacent cell is about 0.2.

The influence of the magnetic field to the adjacent cell is restrained in the magnetic memory device of the above structure, like the first embodiment. Therefore, phenomena such as destruction of the written magnetization state are not absolutely found. It should be noted that in the method of the second embodiment, it is necessary to carry out the writing operation to the plurality of bit lines. However, because the arrangement of pitch between B1 and B2 can be made narrow, the area can be made small. Also, the area can be made smaller by increasing the number of bit lines to write at the same time.

Next, another use of the second embodiment will be described. In this method, the directions of the currents on the bit lines B1 and B2 are made opposite in the writing operation. Thus, data of opposite directions are written in the two cells at the intersections of the word line W1 and the bit lines B1 and B2. The above-mentioned method is carried out for the reading operation. In this case, the data can be determined without using a reference potential by comparing the potentials on the bit lines B1 and B2. In case of this method, the two cells become necessary to store one piece of data. However, because the output potential difference is large compared with the above-mentioned method, the large reading margin can be secured.

It should be noted that the present invention is not limited to the above embodiments and that each embodiment may be appropriately modified in the range of the present invention.

As described above, according to the present invention, the index γ is used which is defined based on the magnetic memory cell pitch p and the distance d between the magnetic memory cells and the wiring line. Also, the correlation of γ, p and d is previously calculated to produce a chart. Based on the chart, the distance between the magnetic memory cell and the wiring line and the magnetic memory cell pitch can be set. In this way, the influence of the write word line to the adjacent magnetic memory cell can be set to a desired range easily and surely. Therefore, the magnetic memory device can be provided in which the magnetization of the adjacent magnetic memory cell is difficult to be through the writing operation.

What is claimed is:

1. A magnetic memory device comprising:
   a plurality of word lines extending into a first direction;
   a plurality of bit lines extending into a second direction to intersect said plurality of word lines; and
   a plurality of magnetic memory cells which are provided at intersections of said plurality of word lines and said plurality of bit lines, and each of which comprises a ferromagnetic film having a changeable magnetic field, wherein data is written to the ferromagnetic film in a first one of said plurality of magnetic memory cells with a synthetic magnetic field generated by first current flowing on a specific one of said plurality of word lines associated with said first magnetic memory cell and second current flowing on a specific one of said plurality of bit lines associated with said first magnetic memory cell,
   a distance d between said first magnetic memory cell and one of said specific word line or said specific bit line meets the following equation (1), $$d \leq p \times (\gamma/(1-\gamma))^{1/2} (0 < \gamma \leq 0.3) \quad (1)$$

where p is a distance between said first magnetic memory cell and a second magnetic memory cell adjacent to said first magnetic memory cell in a specific one of said first direction and said second direction, and γ is a constant,
   wherein said distance d is defined based on a center position of said ferromagnetic film of said first magnetic memory cell and a center of a current distribution in the one of said specific word line and said specific bit line.

2. The magnetic memory device according to claim 1, wherein an easy axis of said first magnetic memory cell is in said first direction.

3. The magnetic memory device according to claim 1, wherein said distance p between said first magnetic memory cell and said second magnetic memory cell is equal to or less than 1 μm.

4. The magnetic memory device according to claim 1, wherein said distance p between said first magnetic memory cell and said second magnetic memory cell is equal to or less than 1 μm.

5. The magnetic memory device according to claim 1, wherein the constant γ is a ratio of a strength of the synthetic magnetic field at the ferromagnetic film of said first memory cell, and a strength of the synthetic magnetic field at the ferromagnetic film of said second magnetic memory cell, in said specific direction.

6. The magnetic memory device according to claim 3, wherein said distance p is defined based on a center position of said first magnetic memory cell and a center position of said second magnetic memory cell.

7. The magnetic memory device according to claim 4, wherein said distance p is defined based on a center position of said first magnetic memory cell and a center position of said second magnetic memory cell.

8. A magnetic memory device comprising:
   a plurality of write word lines extending into a first direction;
   a plurality of read word lines extending into said first direction in parallel to said plurality of write word lines;
   a plurality of bit lines extending into a second direction to intersect said plurality of write word lines; and
   a plurality of magnetic memory cells which are provided at intersections of said plurality of word lines and said plurality of bit lines, and each of which comprises a ferromagnetic film having a changeable magnetic field and a conductive drawing line connected with a corresponding one of said plurality of read word lines,
   wherein data are written in the respective ferromagnetic film of accessed magnetic memory cells as first ones of said plurality of magnetic memory cells with synthetic magnetic fields, each of which is generated by first current flowing on one of said plurality of write word lines associated with a corresponding one of said accessed magnetic memory cells and second current flowing on one of said plurality of bit lines associated with said corresponding accessed magnetic memory cell, a distance d between an end-side one of said accessed magnetic memory cells and one of said associated write word line or said associated bit line meets the following equation (1), $$d \leq p \times (\gamma/(1-\gamma))^{1/2} \quad (0 < \gamma \leq 0.3) \qquad (1)$$

where p is a distance between said end-side accessed magnetic memory cell and a non-accessed one of said plurality of magnetic memory cells adjacent to said end-side accessed magnetic memory cell in a specific one of said first direction and said second direction, and γ is a constant, wherein said distance d is defined based on a center position of said ferromagnetic film of said end-side accessed magnetic memory cell and a center of a current distribution in the one of said write word line associated with said end-side magnetic memory cell and said bit line associated with said end-side magnetic memory cell.

9. The magnetic memory device according to claim 8, wherein an easy axis of said accessed magnetic memory cell is in said first direction.

10. The magnetic memory device according to claim 8, wherein said distance p between said end-side accessed magnetic memory cell and said non-accessed magnetic memory cell is equal to or less than 1 μm.

11. The magnetic memory device according to claim 8, wherein said distance p between said end-side accessed magnetic memory cell and said non-accessed magnetic memory cell is equal to or less than 1 μm.

12. The magnetic memory device according to claim 8, wherein a first wiring line pitch between said bit lines corresponding to said accessed magnetic memory cells is different from a second wiring line pitch between said end-side accessed magnetic memory cell and said non-accessed magnetic memory cell.

13. The magnetic memory device according to claim 10, wherein said first wiring line pitch is smaller than said second wiring line pitch.

14. The magnetic memory device according to claim 8, wherein the constant γ is a ratio of a strength of the synthetic magnetic field at the ferromagnetic film of said end-side accessed magnetic memory cell, and a strength of the synthetic magnetic field at the ferromagnetic film of said non-accessed magnetic memory cell, in said specific direction.

15. The magnetic memory device according to claim 10, wherein said distance p is defined based on a center position of said first magnetic memory cell and a center position of said second magnetic memory cell.

16. The magnetic memory device according to claim 11, wherein said distance p is defined based on a center position of said first magnetic memory cell and a center position of said second magnetic memory cell.

17. A magnetic memory device comprising:

a plurality of word lines extending into a first direction;

a plurality of bit lines extending into a second direction to intersect said plurality of word lines; and a plurality of magnetic memory cells which are provided at intersections of said plurality of word lines and said plurality of bit lines, and each of which comprises a ferromagnetic film having a changeable magnetic field, wherein data is written to the ferromagnetic film in a first one of said plurality of magnetic memory cells with a synthetic magnetic field generated by first current flowing on a specific one of said plurality of word lines associated with said first magnetic memory cell and second current flowing on a specific one of said plurality of bit lines associated with said first magnetic memory cell, a distance dA between said first magnetic memory cell and said specific word line meets the following equation, $$dA \leq pA \times (\gamma A/(1-\gamma A))^{1/2} \quad (0 < \gamma A < 1.0)$$

where pA is a distance between said first magnetic memory cell and a second magnetic memory cell adjacent to said first magnetic memory cell in said second direction, and γA is a ratio of a strength of said synthetic magnetic field in said second direction at the ferromagnetic film of said first magnetic memory cell, and a strength of said synthetic magnetic field in said second direction at the ferromagnetic film of said second magnetic memory cell, wherein said distance dA is defined based on a center position of said ferromagnetic film of said first magnetic memory cell and a center of a current distribution in said specific word line, and a distance dB between said first magnetic memory cell and said specific bit line meets the following equation, $$dB \leq pB \times (\gamma B/(1-\gamma B))^{1/2} \quad (0 < \gamma B < 1.0)$$

where pB is a distance between said first magnetic memory cell and a third magnetic memory cell adjacent to said first magnetic memory cell in said first direction, and γB is a ratio of a strength of said synthetic magnetic field in said first direction at the ferromagnetic film of said first magnetic memory cell, and a strength of said synthetic magnetic field in said first direction at the ferromagnetic film of said third magnetic memory cell, wherein said distance dB is defined based on a center position of said ferromagnetic film of said first magnetic memory cell and a center of a current distribution in said specific bit line.

18. The magnetic memory device according to claim 17, wherein an easy axis of said first magnetic memory cell is in said first direction.

19. The magnetic memory device according to claim 17, wherein said distance pA between said first magnetic memory cell and said second magnetic memory cell is equal to or less than 1 μm, and said distance pB between said first magnetic memory cell and said third magnetic memory cell is equal to or less than 1 μm.

20. The magnetic memory device according to claim 19, wherein γA≦0.3 and γB≦0.3.

21. The magnetic memory device according to claim 17, wherein said distance pA is defined based on a center position of said first magnetic memory cell and a center position of said second magnetic memory cell, and said distance pB is defined based on a center position of said first magnetic memory cell and a center position of said third magnetic memory cell.

* * * * *